United States Patent [19]

Geatz

[11] Patent Number: 5,148,945
[45] Date of Patent: Sep. 22, 1992

[54] APPARATUS AND METHOD FOR THE TRANSFER AND DELIVERY OF HIGH PURITY CHEMICALS

[75] Inventor: Tobin Geatz, Durham, N.C.

[73] Assignee: Applied Chemical Solutions, Hollister, Calif.

[21] Appl. No.: 583,826

[22] Filed: Sep. 17, 1990

[51] Int. Cl.$^5$ .................................. B67D 5/08
[52] U.S. Cl. .......................... 222/1; 222/59;
  222/61; 222/71; 222/135; 222/152; 222/189;
  222/318; 222/399; 137/205; 137/208; 137/209
[58] Field of Search .............. 137/205, 208, 209, 545;
  222/1, 43, 135, 152, 309, 318, 399, 59, 61, 71

[56] References Cited

U.S. PATENT DOCUMENTS

| | | | |
|---|---|---|---|
| 1,460,389 | 7/1923 | Mauclére | 222/399 |
| 2,362,724 | 11/1944 | Shea | 222/59 |
| 3,370,755 | 2/1968 | Querner | 222/482 |
| 3,746,570 | 7/1973 | McIntosh | 222/152 |
| 4,204,612 | 5/1980 | Schrader et al. | 222/59 |

FOREIGN PATENT DOCUMENTS

| | | | |
|---|---|---|---|
| 0354665 | 2/1990 | European Pat. Off. | 222/318 |
| 8203023 | 9/1982 | World Int. Prop. O. | 222/318 |

OTHER PUBLICATIONS

Advertisement: ChemFill—Chemical Delivery System—Brochure of FSI International, Chaska, Minn., Feb. 1988.
Advertisement: "System Overview and Installation Planning" and Overview of Computerized Chemical Distribution Systems—Brochure of Systems Chemistry Incorporated, Milpitas, Calif., May 1989.
Advertising Brochure: Unique Solutions to the Handling and Dispensing of Chemicals With a Commitment to Quality and Support—Integrated Designs, Inc., Dallas, Tex.

Primary Examiner—Donald T. Hajec
Assistant Examiner—Kenneth Bomberg
Attorney, Agent, or Firm—Ferrill, Logan, Johns & Blasko

[57] ABSTRACT

The present invention provides improved method and apparatus for the transfer and delivery of very high purity chemicals for use in semiconductor production and similar processes. By employing multiple alternating pressure vessels, chemicals are drawn from virtually any bulk source and delivered to one or more end-users. The use of a vacuum system to draw chemicals through sealed conduits eliminates the need for pumps which are a source of both maintenance problems and contamination in the system. Multiple vessels provide for a variety of flow options, which include continuous chemical delivery to the end-users, recirculation and regular filtration during periods of low use, and built-in redundancy to avoid system shut down if there is a component failure.

37 Claims, 2 Drawing Sheets

APPARATUS AND METHOD FOR THE TRANSFER AND DELIVERY OF HIGH PURITY CHEMICALS

BACKGROUND OF THE INVENTION

1. Field of the Invention.

The present invention relates to the transfer, storage and delivery of process chemicals. More particularly, the present invention provides improved apparatus and method for the transfer, storage and delivery of ultra-high purity chemicals for use in a variety of industries, such as in the manufacture of semiconductor wafers and similar products.

2. Description of the Prior Art.

In many applications in industry today it is extremely important to maintain process chemicals free of virtually all contaminants. For instance, in the semiconductor industry the purity of chemicals, such as sulfuric acid, hydrogen peroxide, and ammonium hydroxide, used in semi-conductor wafer production must be pure on level of approximately 25 (or fewer) particles per milliliter with a particle size of less than a fraction of a micron. As a result of these purity standards, many conventional methods of chemical transfer and delivery, such as paddled pumps and similar devices, have proven completely unsatisfactory.

Of further concern in these industries is that many of the chemicals employed are toxic and must be carefully handled. In order to assure adequate purity and worker safety, it is extremely important that such chemicals be transferred, stored, and dispensed in a closed system, with minimal contact with the environment or workers.

Generally today one of two methods are employed to effectuate high-purity chemical transfer. The first method is a "pumped delivery." In this method a positive displacement pump, usually an air powered double diaphragm type, is employed to provide both lift at a suction inlet from the bulk source of the chemicals and simultaneous pressure at the output to the enduser. In this system, chemical is lifted from a chemical drum, driven through a pump, and pushed out to the point of use. Although this method is widely employed, it is far from satisfactory.

The deficiencies of the pumped delivery system are manifold. This system is capable of producing only minimal lift from the chemical bulk source--usually on the order of only a few pounds per square inch. Moreover, this system is replete with contamination problems: the rapidly expanding and contracting of the pump diaphragm material (e.g. Teflon ®) causes mechanical degradation, with the degradation by-products (many of which being too small to filter with state-of-the-art filtration equipment) entering the chemical process stream; further, the rapid action of the pump (usually greater than 60 cycle per minute) creates massive impulse in the system with a resulting pulsed flow which forces particles through filters—thus rendering the filters ineffective. Finally, the mechanical shock inherent in this system creates constant maintenance problems.

The other system in general use today addresses only some of these problems. In the "pump/pressure delivery," a positive displacement pump is again employed to provide lift from the bulk source of chemicals. However, the chemicals are delivered to an intermediate vessel from which inert gas pressure is used to motivate chemical to the use areas.

Although the pump/pressure system is better controlled and is more conducive to use of filters to assure chemical purity, it still has serious drawbacks in a submicron chemical environment. Again, lift provided by a double diaphragm pump is restricted. Further, such pumps are prone to degradation—with the by-products entering the chemical stream. Finally, the use of a single pressure vessel for delivery means that delivery is not continuous, but is rather constrained to "batch" sizes based on the size of the pressure vessel. If demand exceeds the volume of the pressure vessel, further delivery must be "queued" while the pump refills the pressure vessel. Alternatively, pressure from the pump that is equal to or greater than the pressure of the delivery vessel must be applied to the delivery vessel to supplement or refill it during demand; this further compounds the filtration and maintenance problems.

Accordingly, it is a primary object of the present invention to provide a chemical transfer and delivery apparatus and method which effectively transfers high-purity process chemicals from any bulk source and delivers them accurately and without contamination to end-use stations.

It is an additional object of the present invention to provide such a transfer and delivery system which provides even flow at a consistent velocity so to permit accurate filtration and to minimize mechanical shock in the system.

It is a further object of the present invention to provide such a transfer and delivery system which does not employ pumps or other transfer apparatus which are subject to degradation or maintenance problems and which employs a minimum of any other moving parts which may be subject to degradation.

It is yet another object of the present invention to provide such a transfer and delivery system which has multiple flow paths so to provide virtually unlimited delivery capacity and built-in redundancy to avoid complete system shut down in instances of failure of a component of the system.

SUMMARY OF THE INVENTION

The present invention provides improved apparatus and method for the transfer and delivery of high purity chemicals from any bulk source to multiple end-use stations.

The invention comprises using a vacuum system and a pressure system to alternately decompress and pressurize a chemical storage vessel. By creating a vacuum in the vessel, chemical can be drawn from the bulk source to the vessel; by creating a pressure in the vessel, chemical may then be delivered to the end-use station or to one or more intermediate vessels capable of being pressurized. The use of multiple vessels allow simultaneous delivery of chemical to end-users and refilling of the vessels; this provides essentially unlimited continuous chemical delivery.

By employing multiple alternating pressure vessels and multiple flow paths, the present invention readily lends itself to many options. These include assuring continuous flow to endusers, providing recirculation and re-filtration during periods of low use, and providing redundancy to insure continued delivery of chemicals even when there is a failure of one or more components in the system. Microprocessor control of the system is readily implemented to provide accurate and instantaneous monitoring and control over all facets of chemical transfer and delivery.

The present invention completely eliminates the need for in-line pumps which are prone to degradation, contamination, and maintenance problems. Moreover, the present invention provides even, controlled flow in the system which greatly reduces maintenance problems and is extremely conducive to accurate filtration and fluid delivery.

A completely closed transfer and delivery system is provided with the present invention which vastly reduces the need to handle any chemicals from initial delivery in a bulk source to dispense of the chemicals at the end-use station. This avoids both health problems for workers and further potential contamination problems.

DESCRIPTION OF THE DRAWINGS

The operation of the present invention should become apparent from the following description when considered in conjunction with the accompanying drawings, in which.

DETAILED DESCRIPTION OF THE INVENTION

The present invention provides improved apparatus and method for accurately and effectively transferring any form of high purity chemical from a bulk source to an end-user station.

Figure 1:
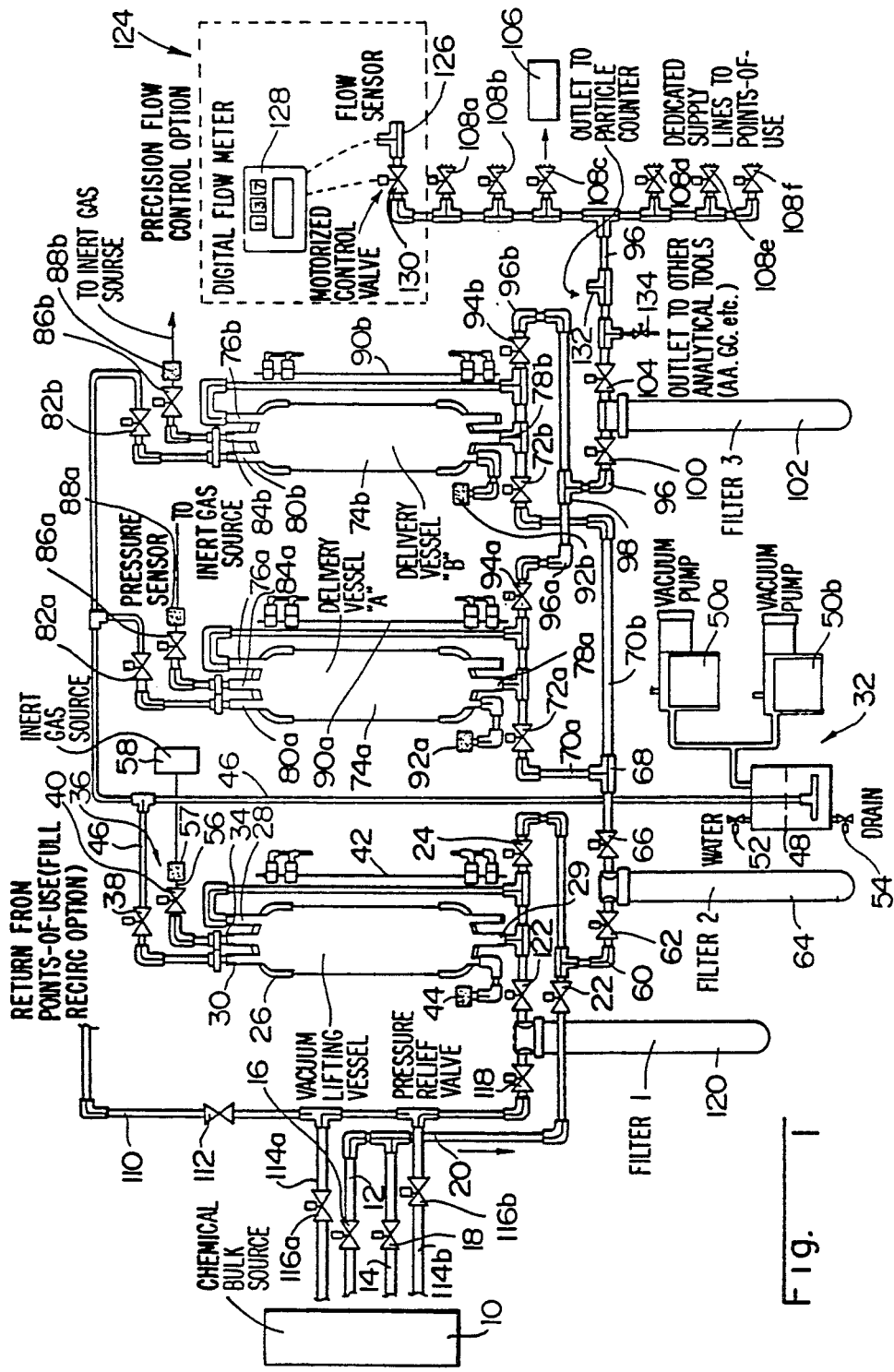
FIG. 1 is a schematic representation of the preferred embodiment of the apparatus of the present invention.

As is shown in FIG. 1, chemical is delivered to an industrial site in a bulk source container 10 of a volume from 5 to 800 or more liters. The bulk source 10 may take the form of a drum or other sealed container with a top, side, or bottom opening. Generally the bulk source 10 has one or more openings in its top, making suction removal of chemical from the bulk source in an upright position the most convenient method of transfer. A source conduit 12 or 14 is inserted into and attached to the bulk source 10 in any known manner to provide for the withdrawal of chemical. Naturally, if a top-opening source 10 is employed, the source conduit 12, 14 should be long enough or include adequate extensions to pass to the bottom of the bulk source 10 to assure the complete removal of chemical from the source. Multiple source conduits 12, 14 are preferred to permit alternating between chemical bulk sources 10 to assure continuous transfer. Each of the source conduits 12, 14 are provided with a fluid handling valve 16 and 18, respectively.

It should be appreciated that as employed throughout this description, all fluid handling valves may be constructed from any suitable material appropriate for particular design specifications and the chemicals employed. As will become apparent, it is important that such valves are capable of handling both liquid and gas fluids and, preferably, fluid pressures of 0 to 100 psig. Diaphragm-type valves constructed of perfluoroalkoxy (PFA) TEFLON ® (i.e. polytetrafluoroethylene) or similar material are preferred.

The source conduits 12, 14 then combine to a main source conduit 20 and pass through valves 22 and 24 and into a lifting vessel 26 via upper port 28 and lower port 29. The lifting vessel 26 is also provided with an opening 30 to attach to a vacuum system 32, and an opening 34 to attach to a pressure system 36. The vacuum system is controlled by valve 38, and the pressure system 36 is controlled by valve 40. For proper operation, a level sensor 42 should be provided to assure accurate monitoring of the fluid level in the vessel 26. A capacitive-type level sensor is preferred. The lifting vessel 26 should also be provided with a pressure release valve 44.

Again, it should be appreciated that as employed throughout this description, all pressure relief valves may be constructed from any suitable material and in accordance with the appropriate design specifications for each installation. The preferred pressure relief valves are rupture disc type designed to burst when pressures exceed user specifications. Generally the valves should be designed to open below 100 psig.

The lifting vessel 26 may be constructed of any suitable material and of any required size. Preferably the vessel 26 is a multiple layer construction of a stainless steel tank (e.g. Type 316L stainless steel, electropolished and passivated), an inner liner of PFA TEFLON or similar material, and an outer pressure tank of polyvinyl chloride (PVC). The vessel 26 should have a pressure operational range of 0 to 100 psig, and a vacuum operational range of 700 to 50 torr. The nominal vessel size should be approximately 20 liters; however, depending on application, vessel size may reach or exceed 900–1000 liters.

The vacuum system 32 comprises fluid handling valve 38, gas evacuation conduit 46, water trap/scrubber 48, and one or more vacuum pumps 50a and 50b. Gas is evacuated from the lifting vessel operating a pump 50 to create a negative pressure in the evacuation conduit 46 and then by opening valve 38.

The pumps 50 may be of any construction and size necessary to create a negative pressure in the lifting vessel of 700 to 50 torr. To adequately evacuate a 20 liter lifting vessel, a vacuum pump with a 5 to 50 CFM capacity should be provided. In order to avoid needless system shut downs, it is preferred that multiple pumps be provided with automatic switching between them in the case of pump failure or need for greater gas evacuation capacity. The water trap/scrubber 48 of known construction is provided as means to remove from the exhaust through conduit 46 any chemical residues which become entrapped in the vacuum stream, and to maintain conduit 46 free of any and all contaminants which may enter the system from the pump 50. A water inlet 52 and a water drain 54 should be provided on the trap 48 to permit periodic replacement of the scrubber water. Naturally, other filtration or scrubber means may be substituted for trap 48.

The pressure system 36 comprises fluid handling valve 40, a pressurized gas conduit 56, a pressure sensor 57, and a pressurized gas source 58. Sufficient gas capacity should be provided to pressurize and maintain the lifting vessel at a pressure of 0 to 100 psig during chemical transfer, and preferably at a pressure of 5 to 15 psig. Although the choice of gas may varying depending on particular applications, generally any noble or inert gas may be employed, such as nitrogen, argon, helium, neon, etc. Nitrogen and argon are preferred for most applications due to cost and availability advantages. Control of the application of pressure to the lifting vessel 26 is controlled by valve 40 in conjunction with pressure sensor 57.

Chemical exiting the lifting vessel 26 through lower port 29 passes through valve 24 and a portion of source conduit 20 to transfer conduit 60. Transfer conduit 60 comprises valve 62, filter unit 64, valve 66, and junction 68. At junction 68 the transfer conduit separates into two separate transfer conduits 70a and 70b. Flow through transfer conduit 70a passes through valve 72a and into delivery vessel 74a via upper port 76a and lower port 78a. Similarly, flow through transfer conduit 70b passes through valve 72b and into delivery vessel 74b via upper port 76b and lower port 78b.

It should be appreciated that in the preferred application of the present invention described herein, both the delivery vessels 74a and 74b are identical in structure and operation. Further, in the embodiment shown, the delivery vessels 74 are also identical to the lifting vessel 26 in structure and operation. Accordingly, each delivery vessel 74 includes: an opening 80 to attach to vacuum system 32 controlled by valve 82; an opening 84 to attach to pressure system 36 controlled by valve 86 and pressure sensor 88; a level sensor 90; and a pressure release valve 92.

Although the delivery vessels 74a, 74b may be provided with their own vacuum system and pressurized gas system, it is preferred that appropriate conduits be provided to utilize one vacuum system and one pressurized gas system for the entire transfer and delivery apparatus.

Chemical exiting either delivery vessels 74a, 74b through lower ports 78a, 78b passes through valve 94a, 94b, into delivery conduit 96a and 96b, and to junction 98. At junction 98 the two delivery conduits 96a, 96b join to form main delivery conduit 96. Flow through delivery conduit 96 passes through valve 100, filter unit 102, valve 104, and may then be split into as many separate individual delivery conduits as may be necessary to service all end user stations (i.e. points of use) 106. Flow to each end user station 106 is controlled by valves 108a through 108f.

A number of important options may be readily employed with the present invention. As is shown in FIG. 1, a return conduit 110 may be provided from either the main delivery conduit 96 or from the delivery conduits at the end user stations 106 to provide for the recirculation of chemical back to the bulk source 10 or back through the transfer and delivery apparatus during times of low use. The purpose of this option is to assure the best particle performance, chemical homogeneity, and regular filtration of all chemicals in the system.

Flow through return conduit 110 is controlled by valve 112. At this stage flow can be directed back to the bulk source 10 via return source conduits 114a or 114b through operation of valves 116a or 116b, respectively. Alternatively, flow may continue to recirculate through the system. This is accomplished by directing flow through conduit 110, valve 118, filter unit 120, and valve 122 to where return conduit 110 joins source conduit 20.

Although this recirculation process may be accomplished manually, it is preferred that the system automatically recirculates chemicals during periods of low or no use. To this end, a flow sensor may be provided in conduit 96 to measure low or no flow which then provides digital feedback to a computer controller, as is described below.

Another option which may be employed is to control the flow rate to the end user stations 106 using a flow control 124 on delivery conduit 96. The flow control comprises: a flow sensor 126, such as a paddle wheel or inductive type, installed in the delivery conduit 96; a flow meter 128, preferably digitally controlled which may be readily interfaced with a computer controller; and a motorized control valve 130, preferably needle valve type made from PFA TEFLON, stainless steel, or similar material, which will respond to the flow meter to provide highly accurate flow rates to the end users. In the preferred application, a digital flow meter 128 is attached to an ultrasonic flow sensor 126 providing a digital or analog output (e.g. 4 to 20 mAmps) to a system controller or programmable logic controller (PLC).

It should be appreciated that the interface of the flow control 124 with a controller may also provide the necessary information on chemical demand necessary to direct the automatic recirculation function discussed above.

Another option which may be necessary in many applications is the addition of one or more filter units throughout the system. Such filters are shown in FIG. 1 as elements 64, 102, and 120. The controlled flow possible with the present invention permits accurate filtration using commercially available filter units. As is known, for applications such as semiconductor wafer production, purity of chemicals must be maintained at a level of 50 particles per milliliter at greater than 0.3 micron or 15 particles per milliliter at greater than 0.5 microns. Semiconductor fluids must be as free of particles as possible. As new materials are made available, the empirical lower limits can be expected to change. However, a basic novelty of the present invention (i.e. low impulse transfer) will remain essential. The intent of the present invention is not to limit its use to particular purity applications, but it should be appreciated that regardless of media or filter size, pulsing flow will always be a problem as will intimate contact of fluid with a centrifugal or rotary vane pump.

Acceptable commercially available filter units include those consistent with MILLIPORE 0.05 micron TEFLON media available from Millipore Corporation of Bedford, Mass. Filter units may be any form as is compatible with the particular use of the present invention. Generally such units are those filtering 0.1 to 0.05 microns absolute (and which also pass a bubble point test).

The size and specific filtration requirements are heavily application dependant. For most semiconductor applications employing 20 liter lifting and delivery vessels, three filter units as shown in FIG. 1 with a flow capacity of 0 to 40 or greater liters per minute and providing filtration at a level of at 10 particles per milliliter at less than 0.2 microns is sufficient.

Not only do the use of filters assure the removal of any contamination generated in the system and help maintain the homogeneity of the chemicals, but accurate filtration may also provide chemical to end user stations which exceed the purity level of the chemicals delivered from the bulk source. It should be appreciated that any of the filtration steps described herein may be comprised of two or more filters oriented in parallel. This arrangement allows service of one filter element while others remain on-line and active.

Other options which may be employed with the present invention are additional outlets throughout the system to provide for periodic sampling and monitoring. Two such outlets are shown on delivery conduit 96 in FIG. 1. Outlet 132 may be used to pass chemical to a particle counter to provide either constant or periodic monitoring of the purity of the chemical in the delivery conduit 96. Outlet 134 may be used to pass chemical to various other analytical apparatus, such as an atomic absorption analyzer (AA), gas chromatograph (CG), or similar devices.

Figure 2:
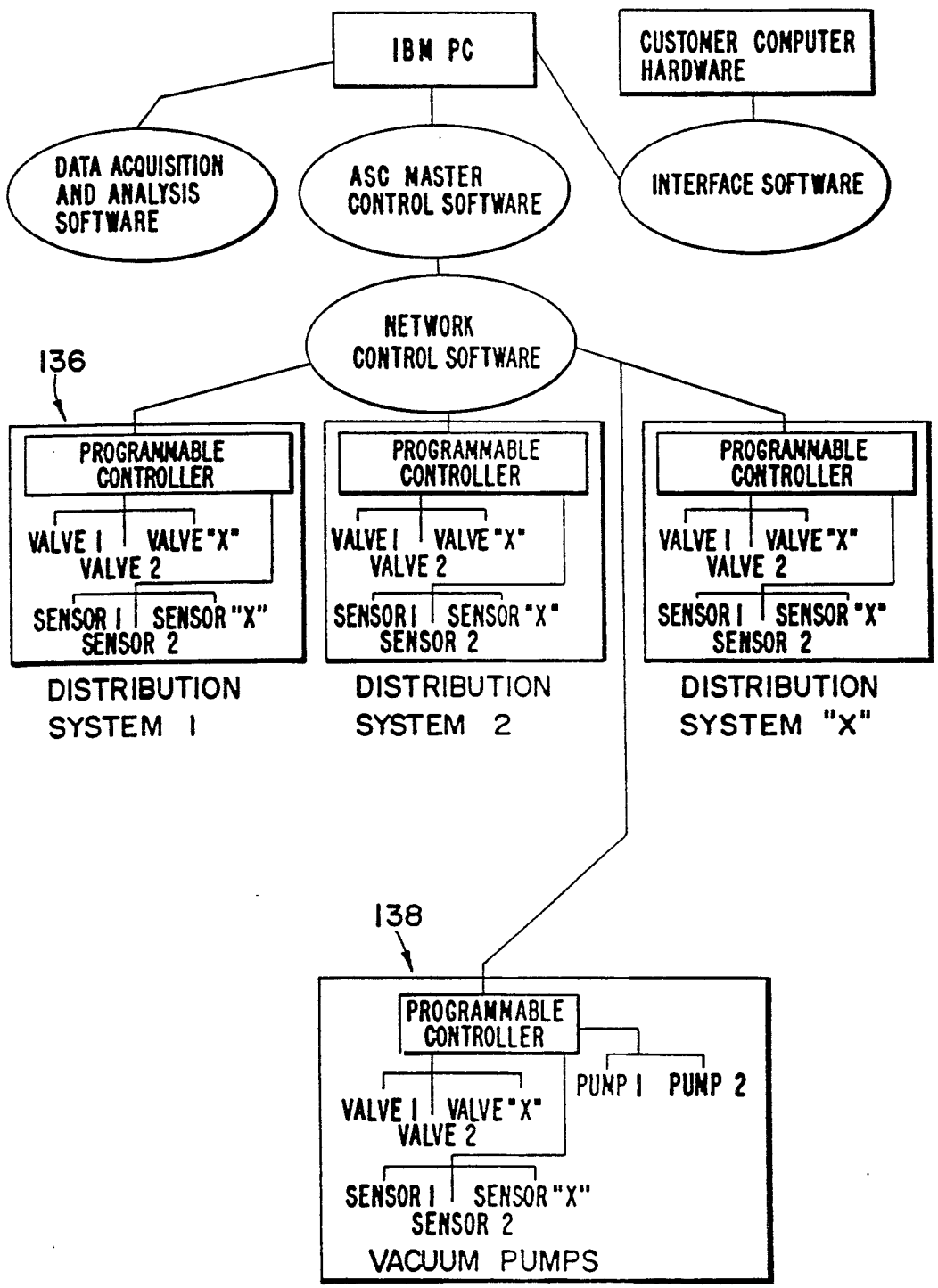
FIG. 2 is a schematic representation of one embodiment of the control apparatus for the present invention.

As is shown in FIG. 2, the present invention particularly lends itself to operation using available microprocessor controls to direct the flow through the system. In "Distribution System 1" 136, a programmable controller, such as a dedicated microprocessor or ladder logic controller, or a dedicated personal computer, may be employed to respond to various digital sensors provided throughout the system. Such sensors include the level sensors 42, 90a, 90b, pressure sensors 57, 88a, 88b, and flow sensor 126. It should be understood that other conventional sensors may be installed throughout the system to monitor flow through and/or pressure in various conduits.

Employing motorized control valves of known construction, the programmable controller may then instantaneously control the flow of chemical throughout the system and adjust for changes in demand or problems in the system. A user interface also allows instant command processing for all necessary maintenance, including purging the system of any given chemical.

As is further shown in FIG. 2, use of known network hardware and software permits the present invention to be controlled in parallel with one or more other chemical transfer and delivery systems. One advantage of such a networked system is that a single bank of vacuum pumps 138 and/or pressurized gas source may be employed to operate multiple distribution systems.

The present invention may be employed to transfer and deliver virtually any form of chemical from a bulk source to a user station. For sub-micron purity semiconductor wafer production, such chemicals include sulfuric acid, ammonium hydroxide, hydrogen peroxide, hydrochloric acid, hydrofluoric acid, or numerous other organic and inorganic chemicals. The choice of materials for the system is heavily application dependant. For most uses, conduits, vessels, valves, etc. may be constructed from or lined in stainless steel, PFA TEFLON, glass, other fluoropolymers (e.g. ECTFE, or PVDF), or polyolefins (e.g. polypropylene, or polyethylene).

The precise method of operation of the present invention will become clear through the following examples:

EXAMPLE 1

To transfer chemical from a commercial tank or bulk source 10 into the delivery vessels 74, the following procedure is employed:

The chemical bulk source 10 is attached to source conduits 12, 14. A minimal vacuum pressure (e.g. 600 to 300 torr (application dependent)) is applied to lifting vessel 26 by operating vacuum system 32 and opening valve 38 with all other valves closed. When the desired pressure is reached, valves 22 and 24 are opened followed by valve 16 or 18 (i.e. depending on the nature of the bulk source attachment and the particular bulk source from which chemical is first desired). In this manner chemical is drawn into the lifting vessel 26. Once the level sensor 42 indicates that the lifting vessel 26 is filled, valve 16 or 18 is closed followed by the closing of valves 22 and 24. Valve 38 is then closed to discontinue vacuum in the lifting vessel 26.

Once the lifting vessel is filled with chemical, valve 40 is then opened and inert gas pressure is applied to the lifting vessel 26 to provide motive force for transfer to either of the two delivery vessels 74a or 74b. When the desired pressure is reached (e.g. 5 to 15 psig), valves 24, 62, 66, and 72a are opened and chemical is tranferred to delivery vessel 74a through filter unit 64. If air has not been previously removed from the delivery vessel 74a, then valve 82a should also be opened at least in part to permit standing gas in the delivery vessel 74a to be displaced by the incoming chemical.

The steps employed to fill and pressurize the lifting vessel 20 26 may then be repeated. Delivery vessel 74b may be filled by opening valves 24, 62, 66, and 72b (and, again if necessary, valve 82b).

EXAMPLE 2

The delivery of chemical from the delivery vessels 74 to the point of use or end user stations 106 based on demand is accomplished in the following manner:

In a stand-by state, both delivery vessels 74a, 74b are pressurized with inert gas to a desired level (e.g. 5 to 15 psig) by opening of valves 86a and 86b. All other valves remain closed. When a demand is sensed, valves 94a, 100, and 104 are opened, followed by the appropriate opening of one of valves 108a through 108f. The inert gas pressure forces chemical from delivery vessel 74a, through filter 102, and through open valve 108 to the end user station 106. In most applications, a flow rate of 0 to 100 liters per minute to the end-use stations is sufficient. Chemical will continue to the end user station 106 until either demand is no longer sensed, or delivery vessel 74a is approaching empty.

If delivery vessel 74a is approaching empty, this information is conveyed by level sensor 90a. If demand is still sensed, valve 94a is closed and valve 94b is opened, allowing chemical to flow uninterrupted from delivery vessel 74b to the end user station 106. While chemical is delivered from delivery vessel 74b, delivery vessel 74a may be refilled in the manner described in Example 1, above.

By alternately switching between delivery vessels in this manner, a continuous flow of chemical may be provided to the point of use so long as required. Once demand at the end user stations 106 ceases, the sequence described in Example 1 is repeated until both delivery vessels 74a, 74b are filled and in the stand-by state.

EXAMPLE 3

The identical construction of the lifting vessel 26 and both delivery vessels 74a, 74b in the preferred embodiment of the present invention described herein is provided to assure built-in backup in the case of a failure of one or more vessels in operation. If one of the vessels fails to function, all necessary valving is provided to permit either of the remaining vessels to serve as either a lifting or delivery vessel. It should also be understood that the present invention will also function with only one operating vessel, in which case it will serve as both a lifting vessel and a delivery vessel. Naturally if operation is reduced to a single vessel, continuous supply can no longer be provided and chemical is then delivered in a "batch" manner, with further demand held waiting while the vessel refills.

EXAMPLE 4

At times of no demand, constant recirculation can be provided to provide constant filtration and insure that chemical remains up to specification. This may be accomplished in the following manner:

When no demand is called for and both delivery vessels 74a, 74b are filled, the lifting vessel continues through the fill sequence described in Example 1, above. However, instead of transferring chemical to the delivery vessels 74a, 74b, the lifting vessel transfers chemical back to the bulk source 10 by opening valves 122, 118, and either 116a or 116b.

EXAMPLE 5

Constant recirculation may also be provided from the delivery vessels 74a, 74b and/or the point of use with the following procedure:

In instances of no chemical demand, chemical can be returned from delivery conduit 96 via return conduit 110 by opening valve 112. The chemical can be returned to the bulk source 10 by way or valve 116a or 116b, or may be transferred to the lifting vessel via valves 118 and 122. In this manner, constant recirculation is provided throughout the system, with thorough filtration and chemical homogeneity and best particle performance assured.

It should be evident from the above examples that endless flow patterns may be contemplated with the present invention. It is a particular advantage of the present invention that it has vast delivery, recirculation and redundancy capabilities while adding little in the way of cost or complexity to presently available systems. Moreover, by minimizing the need for moving parts, and by completely eliminating in-line pump units, the present invention avoids the severe contamination and maintenance problems which would be encountered by attempting such flow patterns with conventional transfer and delivery apparatus.

While the present invention is primarily directed to the effective transfer and delivery of chemicals used in certain industries today which must be maintained pure on a sub-micron level of contaminants, and especially to the handling of chemicals used in the production of wafers in the semiconductor industry and for similar processes, the present invention is not so limited.

It should be appreciated that the present invention may also be applied to the transfer and delivery of any form of chemical in virtually any industry, and particularly to the transfer and delivery of chemicals which must be maintained at a high-level of purity. Another example is the pharmaceutical or biomedical fields where physically labile media (e.g. biological suspensions, etc.) could be altered or destroyed by intimate and/or violent contact with impulse or rotary pumps. Accordingly, the term "chemical" as used in this application is intended to include any form of liquid, and should be understood to include either pure or mixed chemicals and liquids with living microorganisms or other substances suspended therein.

While particular embodiments of the present invention have been illustrated and described herein, the present invention should not be limited to such illustrations and description. It should be apparent that changes and modifications may be incorporated and embodied as part of the present invention within the scope of the following claims.

What is claimed is:

1. A process for providing chemical transfer and delivery of chemical from a bulk source to an end-use station which comprises
   providing a lifting vessel;
   providing a source conduit between the bulk source and the lifting vessel, includign a valve to control fluid flow through the source conduit;
   providing a vacuum system in communication with the lifting vessel and including means to evacuate gas selectively from the lifting vessel;
   providing a pressure system, operated independelty of said vacuum system, in communication with the lifting vessel and including means to pressurize selectively the lifting vessel;
   providing a delivery vessel in communication with the lifting vessel;
   providing a delivery conduit from the delivery vessel to the end-use station, including a valve to control fulid flow through the delivery conduit;
   providing connecting conduits among the lifting vessel, the delivery vessel, and the end use station, includign valving to regulate flow through such conduits, so as to allow any vessel to be bypassed in the system without affecting the operation of the system;
   wherein chemical is transferred from the bulk source to the end-use station by the process comprising
   employing the vacuum system to evacuate the lifting vessel of gas so to create a negative pressure therein;
   opening the valve on the source conduit between the bulk source and the lifting vessel so to cause the chemical to be drawn from the bulk source to the lifting vessel;
   closing the valve on the source conduit and pressurizing the lifting vessel;
   causing the chemical under pressure in the lifting vessel to transfer to the delivery vessel;
   dispensing chemical under pressure from the delivery vessel to the end-use station as needed by controlling a valve on the delivery conduit; and
   allowing continuous flow to the end-use station on demand with a constant rate discharge.

2. The method of claim 1 wherein said delivery vessel comprises multiple delivery vessels, including at least a first and a second delivery vessel, and chemical is alternately transferred from the lifting vessel to each of the delivery vessels.

3. The method of claim 2 wherein chemical is dispensed to the end use station initially from the first delivery vessel, and, when the first delivery vessel approaches empty, chemical is then dispensed to the end use station from the second delivery vessel while the first delivery vessel is refilled.

4. The method of claim 1 wherein the chemical is filtered by filter means between the bulk source and the end use station.

5. The method of claim 4 wherein the filter means comprises a sub-micron filter filtering particles of at least 0.1 micron.

6. The method of claim 1 wherein the vacuum produced in the lifting vessel by the vacuum system is between 700 and 50 torr.

7. The method of claim 6 wherein pressurized gas provided by the pressure system is delivered at a pressure of between at least 0 and 150 psig.

8. The method of claim 1 wherein
   means are provided to recirculate the chemical from the delivery vessel to the bulk source; and
   the chemical is recirculated to the bulk source during periods of low demand at the end use stations.

9. The method of claim 1 wherein means are provided to recirculate the chemical from the lifting vessel to the bulk source; and the chemical is recirculated to the bulk source during periods of low demand at the end use stations.

10. An apparatus for providing chemical transfer and delivery of chemical from a bulk source to an end-use station which comprises a lifting vessel;

a source conduit between the bulk source and the lifting vessel, including a valve to control fluid flow through the source conduit;

a vacuum system in communication with the lifting vessel and including means to evacuate gas selectively from the lifting vessel;

a pressure system, operated independently of said vacuum system, in communication with the lifting vessel pressurize selectively the lifting vessel;

a delivery vessel in communication with the lifting vessel, including a transfer conduit permitting the transfer of chemical from the lifting vessel to the delivery vessel;

a delivery conduit from the delivery vessel to the end-use station, including a valve to control fluid flow through the delivery conduit;

a connecting conduits between the lifting vessel, the delivery vessel, and the end use station including valving to regulate flow through such conduits so to allow any vessel to be bypassed in the system without affecting the operation of the wherein said connecting means may include said transfer conduit and said delivery conduit system.

11. The apparatus of claim 10 wherein sub-micron filter means are provided between the lifting vessel and the delivery vessel.

12. The apparatus of claim 10 wherein sub-micron filter means are provided between the delivery vessel and the end-use station.

13. The apparatus of claim 10 wherein the vacuum system comprises a vacuum pump in fluid communication with the lifting vessel and valve means to control the evacuation of gas from the lifting vessel.

14. The apparatus of claim 13 wherein the vacuum system produces a vacuum of between 700 and 50 torr in the lifting vessel.

15. The apparatus of claim 10 wherein the pressure system comprises a pressurized inert gas source in fluid communication with the lifting vessel and valve means to control the release of pressurized gas into the lifting vessel.

16. The apparatus of claim 15 wherien the inert gas is selected from the group consisting of helium, argon, neon, and nitrogen.

17. The apparatus of claim 15 wherein the pressure system produces a pressure of at least 0 to 150 psig in the lifting vessel.

18. The apparatus of claim 10 wherein means is provided on the delivery vessel to pressurize the vessel to a pressure of at least 0 to 150 psig.

19. The apparatus of claim 10 wherein means are provided to recirculate the chemical in the lifting vessel to the bulk source.

20. The apparatus of claim 19 wherein the means to recirculate the chemical comprises: said pressure system; a return conduit communicating between the lifting vessel and the bulk source; and at least one valve on the return conduit to control the flow therethrough.

21. The apparatus of claim 20 wherein the means to recirculate the chemical includes filter means on the return conduit.

22. The apparatus of claim 10 wherein means are provided to recirculate the chemical in the delivery conduit to the bulk source when there is low demand for the chemical at the end-use station.

23. The apparatus of claim 22 wherein the means to recirculate the chemical comprises:

said pressure system;

flow sensing means to monitor demand for chemical at the end-use station;

a return conduit between the delivery conduit and the bulk source; and valve means on the return conduit responsive to the flow sensing means to redirect chemical flow through teh return conduit during periods of low demand for the chemical at the end-use station.

24. The apparatus of claim 10 wherein one container serves as both the lifting vessel and the delivery vessel.

25. The apparatus of claim 10 wherein said delivery vessel comprises multiple delivery vessels, and chemical is alternately transferred from the lifting vessel to each of the delivery vessels.

26. The apparatus of claim 25 wherein each delivery vessel is provided with means to sense the level of chemical in the delivery vessel and means are provided to switch between delivery vessels to supply the delivery conduit continuously when a supplying delivery vessel approaches empty.

27. The apparatus of claim 25 wherein each of the vessels are in communication with the source conduit, the pressure system, the vacuum system, and the delivery conduit, and each vessel may serve as required as both a lifting vessel and a delivery vessel.

28. The apparatus of claim 10 wherein the delivery conduit is provided with means to control rate of flow therethrough.

29. The apparatus of claim 28 wherein the means to control the rate of flow through the delivery conduit comprises a flow sensor in communication with the delivery conduit;

a flow meter responsive to the flow sensor; and an adjustable control valve on the delivery conduit, controlled by the flow meter to adjust flow through the delivery conduit.

30. An apparatus for transfer and delivery of chemical from a bulk source to an end-use stationw hich comprises:

at least one vessel;

means to produce and control alternating pressures in the vessel between a negative pressure and a positive pressure;

a source conduit between the bulk source and the vessel;

a delivery conduit between the vessel and the end-use station;

a recirculation conduit from the vessel back to the bulk source;

wherein chemical is transferred between the bulk source and the vessel by producing a substantial negative pressure in the vessel by means of a vacuum pump and drawing the chemical into the vessel through the source conduit;

chemical is transferred between the vessel and the end-use station by producing a positive pressure in the vessel and forcing the chemical to the end-use station through the delivery conduit; and chemical is recirculated back to the bulk source during periods of low deamdn at the end use stations by producing a positive pressure in the vessel and forcing chemical to the bulk source through the recirculation conduit.

31. The apparatus of claim 30 wherein the means to produce and control alternating pressures in the vessel between a negative pressure to a positive pressure comprises a vacuum system including the vacuum pump, a gas evacuation conduit communicating between the vessel andthe vacuum pump, and valving to control the flow of gas through the gas evacuation conduit; and a pressure system including a pressurized gas source, a pressurized gas conduit communicating between the vessel and the gas source, and valving to control the flow of gas through the pressurized gas conduit.

32. The apparatus of claim 30 wherien multiple vessels are provided and means are provided to permit and control flow between vessels.

33. The apparatus of claim 32 wherein said multiple vessels comprise first and second vessels wherein the first vessel is employed to lift chemical from the bulk source through teh source conduit, chemical is transferred from the first vessel to the second vessel, and chemical is supplied to the end use station by the second vessel via the delivery conduit.

34. The apparatus of claim 30 wherein the delivery conduit is segmented into multiple delivery conduits so as to supply chemical to multiple end use stations, with flow through each segmented delivery conduit controlled by separate valve means.

35. Apparatus for the transfer and delivery of high purity chemical from a bulk source to an end use station which comprises:

a source conduit which attaches to the bulk source and communicates chemical to a first vessel;

a vacuum system in communication with the first vessel which is capable of evacuating gas from the first vessel and producing a negative pressure therein so to cause the chemical to be drawn from the bulk source into the first vessel;

a pressure system in communication with the first vessel which is capable of producing a positive pressure in the first vessel so to force chemical from the first vessel to a second vessel in communication with the first vessel;

a pressure system in communication with the second vessel which is capable of producign a positive pressure in the second vessel so to force chemical from the second vessel through a delivery conduit, chemical being supplied to the end use station by way of the delivery conduit; and wherein means are provided to sense the demand for chemical at the end use station, and means are provided responsive to said sensing means to recirculate chemical from the apparatus back to the bulk source during periods of low demand for chemical.

36. The apparatus of claim 35 wherein a third vessel is provided in communication with both the first vessel and the delivery conduit, chemical being alternately transferred between the first and the second vessels and the first and the third vessels;

level sensing means are provided on both the second and the third vessels, and means are provided to switch flow of chemical to the delivery conduit from between the second and the third vessels;

wherein chemical delivered to the end use station is from the second vessel until a low level of chemical is detected therein, and then chemical delivery is switched to draw from the third vessel, with the second vessel then refilled from the first vessel; and wherein chemical delivery to the end use station is from the third vessel until a low level of chemical is detected therein, and then chemical delivery is switched to draw from the second vessel, with the third vessel then refilled from the first vessel.

37. A process for providing chemical transfer and delivery of chemical from a bulk source to an end-use station which comprises providing a lifting vessel;

providing a source conduit between the bulk source and the lifting vessel, including a valve to control fluid flow through the source conduit;

providing a vacuum system in communication with the lifting vessel and including means to evacuate gas selectively from the lifting vessel;

providing a pressure system, operated and controlled independently of said vacuum system, in communication with the lifting vessel and including means to pressurize selectively the lifting vessel;

providing a delivery vessel in communication with the lifting vessel;

providing a delivery conduit from the delivery vessel to the end-use station, including a valve to control fluid flow through the delivery conduit;

providing connecting conduits between the lifting vessel, the delivery vessel, and the end use station including valving to regulate flow through such conduits so to allow any vessel to be bypassed in the system without effecting the operation of the system;

wherein chemical is transferred from the bulk source to the end-use station by the process comprising employing the vacuum system to evacuate the lifting vessel of gas so to create a negative pressure therein;

opening the valve on the source conduit between the bulk source and the lifting vessel so to cause the chemical to be drawn from the bulk source to the lifting vessel;

closing the valve on the source conduit and pressurizing the lifting vessel;

causing the chemical under pressure in the lifting vessel to transfer to the delivery vessel; and dispensing chemical under pressure from the delivery vessel to the end-use station as needed by controlling a valve on the delivery conduit;

allowing continuous flow to the end-use station as needed with a constant rate discharge;

wherein means are provided to recirculate the chemical from the delivery vessel to the bulk source; and the chemical is recirculated to the bulk source during periods of low demand at the end use stations.

* * * * *

UNITED STATES PATENT AND TRADEMARK OFFICE
CERTIFICATE OF CORRECTION

PATENT NO. : 5,148,945  
DATED : September 22, 1992  
INVENTOR(S) : Tobin Geatz

Page 1 of 2

It is certified that error appears in the above-identified patent and that said Letters Patent is hereby corrected as shown below:

| | |
|---|---|
| Column 1, line 41: | "enduser" should be --end-user-- |
| Column 2, line 63: | "enduser" should be --end-user-- |
| Column 10, line 18: | "includign" should be --including-- |
| Column 11, line 17: | insert --to-- before "pressurize" |
| Column 11, line 26: | "conduits" should be --means-- |
| Column 11, line 28: | "conduits" should be --means-- |
| Column 11, line 29: | insert --as-- before "to allow" |
| Column 11, line 30: | insert --system-- between "the" and "wherein" |
| Column 11, line 32: | delete "system" after "conduit" |
| Column 11, line 51: | "wherien" should be --wherein-- |
| Column 12, line 17: | "teh" should be --the-- |
| Column 13, line 4: | "deamdn" should be --demand-- |
| Column 13, line 14: | leave space between "andthe" |
| Column 13, line 28: | "teh" should be --the-- |

UNITED STATES PATENT AND TRADEMARK OFFICE
CERTIFICATE OF CORRECTION

PATENT NO. : 5,148,945
DATED : September 22, 1992
INVENTOR(S) : Tobin Geatz

It is certified that error appears in the above-indentified patent and that said Letters Patent is hereby corrected as shown below:

Column 13, line 53, "producign" should be --producing--

Signed and Sealed this

Eleventh Day of January, 1994

Attest:

BRUCE LEHMAN

Attesting Officer

Commissioner of Patents and Trademarks

REEXAMINATION CERTIFICATE (2947th)
United States Patent [19]
Geatz

[11] B1 5,148,945
[45] Certificate Issued Jul. 2, 1996

[54] APPARATUS AND METHOD FOR THE TRANSFER AND DELIVERY OF HIGH PURITY CHEMICALS

[75] Inventor: Tobin Geatz, Durham, N.C.

[73] Assignee: Applied Chemical Solutions, Durham, N.C.

Reexamination Request:
No. 90/003,602, Oct. 14, 1994

Reexamination Certificate for:
Patent No.: 5,148,945
Issued: Sep. 22, 1992
Appl. No.: 583,826
Filed: Sep. 17, 1990

Certificate of Correction issued Jan. 11, 1994.

[51] Int. Cl.⁶ .................................................. B67D 5/08
[52] U.S. Cl. ..................... 222/1; 222/59; 222/61; 222/71; 222/135; 222/152; 222/189.08; 222/318; 222/399; 137/205; 137/208; 137/209
[58] Field of Search ...................... 137/205, 208, 137/209, 545; 222/1, 43, 135, 152, 309, 318, 399, 59, 61, 71, 189.08

[56] References Cited

U.S. PATENT DOCUMENTS

| | | | |
|---|---|---|---|
| 3,696,971 | 10/1972 | Maclin | 222/183 |
| 3,797,744 | 3/1974 | Smith | 239/172 |
| 3,976,087 | 8/1976 | Bolton et al. | 137/15 |
| 4,254,805 | 3/1981 | Reeder | |
| 4,405,061 | 9/1983 | Bergandy | |
| 4,676,404 | 6/1987 | Yamazaki et al. | |

OTHER PUBLICATIONS

Micro–Image Technology, Ltd., Brochure for MICRO-GUARD Autofill Chemical Supply Systems, Aug. 1989, pp. 1–6.

Angel Publishing, European Semiconductor, vol. II, No. 5, Jul. 1989, pp. 1 (Cover), 3, 4, and reader service card.

*Primary Examiner*—Andres Kashnikow

[57] ABSTRACT

The present invention provides improved method and apparatus for the transfer and delivery of very high purity chemicals for use in semiconductor production and similar processes. By employing multiple alternating pressure vessels, chemicals are drawn from virtually any bulk source and delivered to one or more end-users. The use of a vacuum system to draw chemicals through sealed conduits eliminates the need for pumps which are a source of both maintenance problems and contamination in the system. Multiple vessels provide for a variety of flow options, which include continuous chemical delivery to the end-users, recirculation and regular filtration during periods of low use, and built-in redundancy to avoid system shut down if there is a component failure.

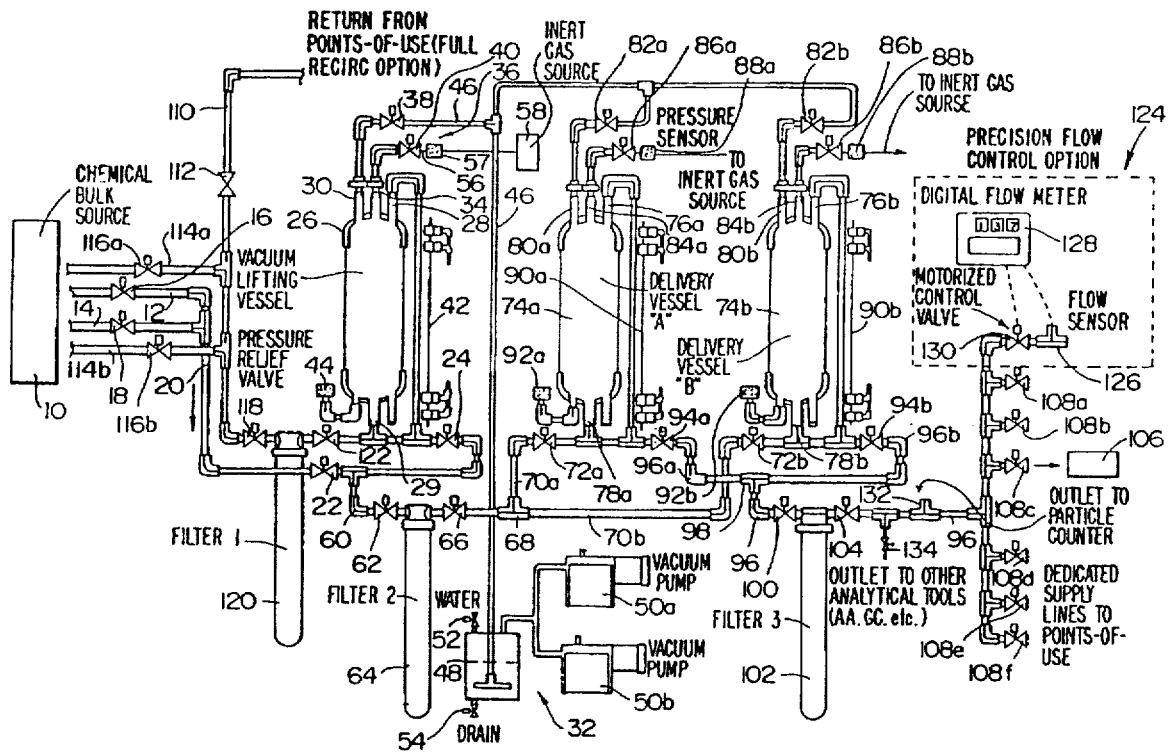

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 35–37 is confirmed.

Claims 19–21 are cancelled.

Claims 1, 10, 30 and 34 are determined to be patentable as amended.

Claims 2–9, 11–18, 22–29, 31–33 dependent on an amended claim, are determined to be patentable.

New claims 38–44 are added and determined to be patentable.

1. A process for providing chemical transfer and delivery of chemical from a bulk source to an end-use station which comprises providing a lifting vessel;

providing a source conduit between the bulk source and the lifting vessel, [includign] *including* a valve to control fluid flow through the source conduit;

providing a vacuum system in communication with the lifting vessel and including means to evacuate gas selectively from the lifting vessel;

providing a pressure system, operated [independelty] *independently* of said vacuum system, in communication with the lifting vessel and including means to pressurize selectively the lifting vessel;

providing a delivery vessel in communication with the lifting vessel;

providing a delivery conduit from the delivery vessel to the end-use station, including a valve to control [fulid] *fluid* flow through the delivery conduit;

providing connecting conduits among the lifting vessel, the delivery vessel, and the end use station, including valving to regulate flow through such conduits, so as to allow any vessel to be bypassed in the system without affecting the operation of the system;

wherein chemical is transferred from the bulk source to the end-use station by the process comprising employing the vacuum system to evacuate the lifting vessel of gas so to create a negative pressure therein;

opening the valve on the source conduit between the bulk source and the lifting vessel so to cause the chemical to be drawn from the bulk source to the lifting vessel;

closing the valve on the source conduit and pressurizing the lifting vessel;

causing the chemical under pressure in the lifting vessel to transfer to the delivery vessel;

dispensing chemical under presure from the delivery vessel to the end-use station as needed by controlling a valve on the delivery conduit; and allowing continuous flow to the end-use station on demand with a constant rate discharge.

10. An apparatus for providing chemical transfer and delivery of chemical from a bulk source to an end-use station which comprises a lifting vessel;

a source conduit between the bulk source and the lifting vessel, including a valve to control fluid flow through the source conduit;

a vacuum system in communication with the lifting vessel to evacuate gas selectively from the lifting vessel;

a pressure system, operated independently of said vacuum system, in communication with the lifting vessel to pressurize selectively the lifting vessel;

a delivery vessel in communication with the lifting vessel, including a transfer conduit permitting the transfer of chemical from the lifting vessel to the delivery vessel;

a delivery conduit from the delivery vessel to the end-use station, including a valve to control fluid flow through the delivery conduit;

a connecting means among the lifting vessel, the delivery vessel, and the end-use station, including valving to regulate flow through such connecting means, so as to allow any vessel to be bypassed in the system without affecting the operation of the system wherein said connecting means may include said transfer conduit and said delivery conduit[.] *;*

*a return conduit communicating between the lifting vessel and the bulk source to recirculate chemical in the lifting vessel to the bulk source; and*

*filter means in the return conduit for filtering the recirculated chemical.*

30. An apparatus for transfer and delivery of chemical from a bulk source to an end-use [stationw hich] *station which* comprises:

at least one vessel;

means to produce and control alternating pressures in the vessel between a negative pressure and a positive pressure;

a source conduit between the bulk source and the vessel;

a delivery conduit between the vessel and the end-use station;

a recirculation conduit from the vessel back to the bulk source;

wherein chemical is transferred between the bulk source and the vessel by producing a substantial negative pressure in the vessel by means of a vacuum pump and drawing the chemical into the vessel through the source conduit;

chemical is transferred between the vessel and the end-use station by producing a positive pressure in the vessel and forcing the chemical to the end-use station through the delivery conduit; and chemical is recirculated back to the bulk source during periods of low demand at the end use stations by producing a positive pressure in the vessel and forcing chemical to the bulk source through the recirculation conduit.

34. The apparatus of claim 30 wherein the delivery conduit is segmented into multiple delivery conduits so [as] to supply chemical to multiple end use stations, with flow through each segmented delivery conduit controlled by separate valve means.

*38. An apparatus for providing chemical transfer and delivery of chemical from a bulk source to an end-use station which comprises:* a lifting vessel;

a source conduit between the bulk source and the lifting vessel, including a valve to control fluid flow through the source conduit;

a vacuum system in communication with the lifting vessel to evacuate gas selectively from the lifting vessel;

a pressure system, operated independently of said vacuum system, in communication with the lifting vessel to pressurize selectively the lifting vessel;

a delivery vessel in communication with the lifting vessel, including a transfer conduit permitting the transfer of chemical from the lifting vessel to the delivery vessel;

a delivery conduit from the delivery vessel to the end-use station, including a valve to control fluid flow through the delivery conduit;

a return conduit between the delivery conduit and the bulk source to recirculate chemical to the bulk source;

filter means in the return conduit for filtering the recirculated chemical;

flow sensing means to monitor demand for chemical at the end-use station;

valve means on the return conduit responsive to the flow sensing means to redirect chemical flow through the return conduit during periods of low demand for the chemical at the end-use station; and a connecting means among the lifting vessel, the delivery vessel, and the end-use station, including valving to regulate flow through such connecting means, so as to allow any vessel to be bypassed in the system without affecting the operation of the system wherein said connecting means may include said transfer conduit and said delivery conduit.

39. The apparatus of claim 38 wherein one container serves as both the lifting vessel and the delivery vessel.

40. The apparatus of claim 38 wherein said delivery vessel comprises multiple delivery vessels, and chemical is alternately transferred from the lifting vessel to each of the delivery vessels.

41. The apparatus of claim 40 wherein each delivery vessel is provided with means to sense the level of chemical in the delivery vessel and means are provided to switch between delivery vessels to supply the delivery conduit continuously when a supplying delivery vessel approaches empty.

42. The apparatus of claim 40 wherein each of the vessels is in communication with the source conduit, the pressure system, the vacuum system, and delivery conduit, and each vessel may serve as required as both a lifting vessel and a delivery vessel.

43. The apparatus of claim 38 wherein the delivery conduit is provided with means to control rate of flow therethrough.

44. The apparatus of claim 43 wherein the means to control the rate of flow through the delivery conduit comprises:

a flow sensor in communication with delivery conduit;

a flow meter responsive to the flow sensor; and an adjustable control valve on the delivery conduit, controlled by the flow meter to adjust flow through the delivery conduit.

* * * * *